United States Patent [19]
Kohyama

[11] Patent Number: 5,959,324
[45] Date of Patent: *Sep. 28, 1999

[54] SEMICONDUCTOR DEVICE INCLUDING AN IMPROVED TERMINAL STRUCTURE

[75] Inventor: Yusuke Kohyama, Kawasaki, Japan

[73] Assignee: Kabushiki Kaisha Toshiba, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/890,376

[22] Filed: Jul. 11, 1997

Related U.S. Application Data

[62] Division of application No. 08/430,287, Apr. 28, 1995, Pat. No. 5,691,550, which is a continuation of application No. 08/038,278, Mar. 29, 1993, abandoned.

[30] Foreign Application Priority Data

Mar. 30, 1992 [JP] Japan .................................. 4-74485

[51] Int. Cl.$^6$ .................. H01L 27/108; H01L 29/76; H01L 29/94
[52] U.S. Cl. .................. 257/301; 257/303; 257/306
[58] Field of Search .................. 438/545, 548, 438/556, 561, 243, 244, 246, 247, 249, 386, 387, 389, 390, 392; 257/301, 296, 302, 303, 304, 305, 306

[56] References Cited

U.S. PATENT DOCUMENTS

| | | | |
|---|---|---|---|
| 4,845,051 | 7/1989 | Cogan et al. | 438/561 |
| 4,918,502 | 4/1990 | Kaga et al. | 257/304 |
| 5,045,904 | 9/1991 | Kobayishi et al. | 257/304 |
| 5,155,059 | 10/1992 | Hieda | 438/247 |
| 5,242,845 | 9/1993 | Baba et al. | 438/243 |
| 5,348,905 | 9/1994 | Kenney | 438/392 |
| 5,521,115 | 5/1996 | Park et al. | 438/243 |
| 5,629,226 | 5/1997 | Ohtsuki | 438/389 |

FOREIGN PATENT DOCUMENTS

| | | | |
|---|---|---|---|
| 62-208662 | 9/1987 | Japan | 257/296 |
| 63-136558 | 6/1988 | Japan | 257/296 |
| 63-136559 | 6/1988 | Japan | 257/296 |
| 64-11360 | 1/1989 | Japan | 257/296 |
| 2 199 695 | 6/1988 | United Kingdom | 257/296 |
| 2 215 913 | 9/1989 | United Kingdom | 257/296 |

*Primary Examiner*—Steven H. Loke
*Attorney, Agent, or Firm*—Banner & Witcoff, Ltd.

[57] ABSTRACT

A semiconductor device includes a first N-type region formed in a P-type silicon substrate, trenches formed in the substrate, second N-type regions each formed from at least the bottom of a corresponding one of the trenches into the substrate, these second N-type regions contacting each other to constitute a wiring layer and being also in contact with the first N-type region, and an electrode for applying a predetermined potential to the second N-type regions via the first N-type region. Since a potential is supplied to the wiring layer formed in the substrate via the first N-type region, no special design, such as formation of a terminal trench, is required. A potential can be easily supplied to the wiring layer formed in the semiconductor substrate, and the device can be easily fabricated.

14 Claims, 10 Drawing Sheets

F I G. 6A-III

FIG. 6B-II

FIG. 6B-III

FIG. 6C-II

FIG. 6C-III

F I G. 6D-III

F I G. 6E-II

F I G. 6E-III

FIG. 6F-III

FIG. 6G-II

FIG. 6G-III

SEMICONDUCTOR DEVICE INCLUDING AN IMPROVED TERMINAL STRUCTURE

This application is a divisional of application Ser. No. 08/430,287, filed Apr. 28, 1995, now U.S. Pat. No. 5,691,550, which is a continuation of application Ser. No. 08/038,278, filed Mar. 29, 1993, now abandoned.

BACKGROUND OF THE INVENTION

1. Field of the Invention

The present invention relates to a semiconductor device and a method of fabricating the same and, more particularly, to a semiconductor device with an internal wiring layer and a method of fabricating the same.

2. Description of the Related Art

Conventional examples of a semiconductor device with a wiring layer in a semiconductor substrate are a dynamic RAM cell disclosed in "A 4.2 $\mu m^2$ Half-Vcc Sheath-Plate Capacitor DRAM Cell with Self-Aligned Buried Plate-Wiring" T. Kaga et al., International Electron Devices Meeting Technical Digest, 1987, pp. 332 to 335 and a dynamic RAM cell disclosed in "Semiconductor Memory Having Trench Capacitor Formed With Sheath Electrode" U.S. Pat. No. 4,918,502 to T. Kaga et al.

Each DRAM cell disclosed in the above literature has an N-type diffusion layer formed by diffusion into a P-type substrate from the bottom of each trench formed in the P-type substrate. These N-type diffusion layers are electrically connected with each other by contacting each other to thereby constitute a wiring layer inside the substrate. This wiring layer in the above DRAM cell functions as a wire for applying a potential to the plate electrode of a capacitor. In this DRAM cell, however, the wiring layer is formed inside the substrate. Therefore, applying a potential to this wiring layer requires a specific design: one of trenches is caused to serve as an exclusive terminal for the potential supply. For this reason, in the above cell, one trench is caused to serve as a terminal (to be referred to as a "terminal trench" hereinafter) as follows. An oxide film is formed on the side walls of a trench in order to constitute a so-called "sheath capacitor." In the terminal trench, this oxide film is removed by photolithography and an N-type diffusion layer is formed on the entire surfaces of the trench. This N-type diffusion layer is formed in contact with N-type diffusion layers formed by diffusion from the bottoms of the other trenches to together serve as a wiring layer. A potential is supplied to these N-type diffusion layers serving as a wiring layer from the diffusion layer formed on the entire surfaces of the terminal trench. The device of this type is described in, e.g., U.S. Pat. No. 4,918,502 with reference to FIGS. 10D to 10N.

Figure 1:
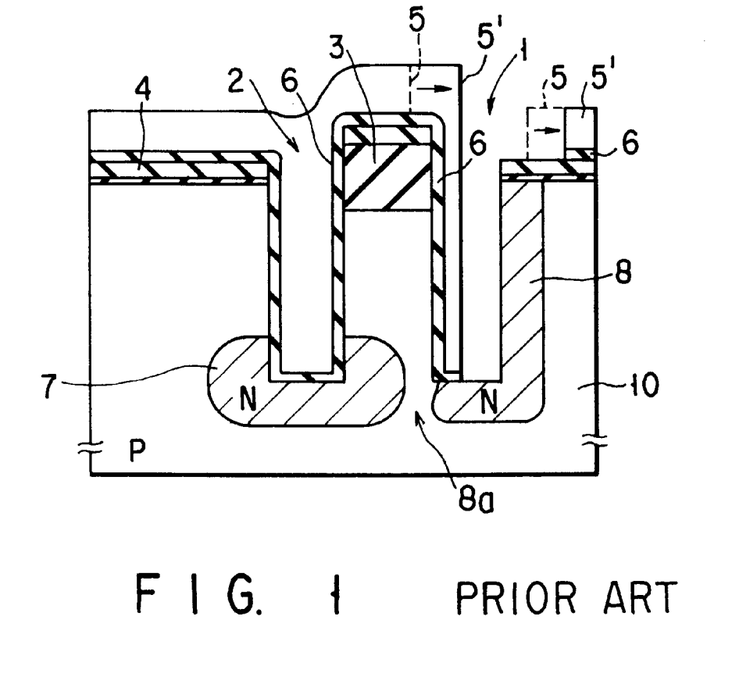
FIG. 1 is a schematic sectional view for explaining a drawback of a conventional semiconductor device.
Figure 2:
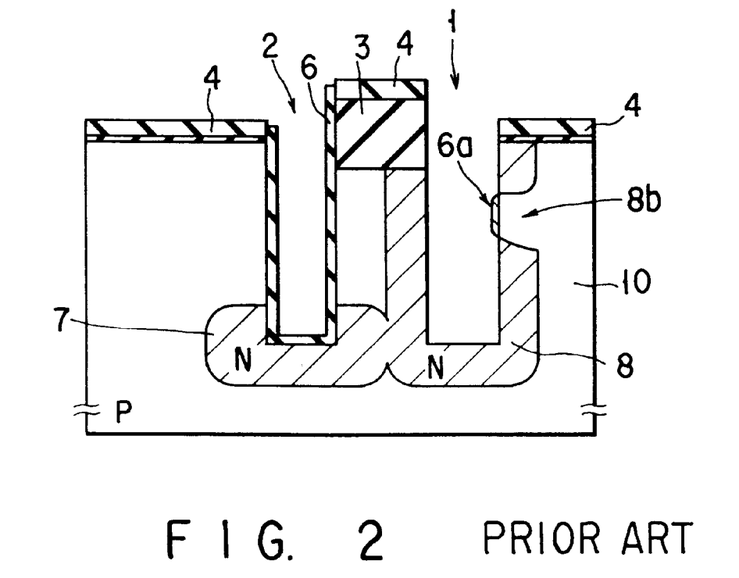
FIG. 2 is a schematic sectional view for explaining another drawback of a conventional semiconductor device.

In a semiconductor device having a wiring layer inside a semiconductor substrate, it is not easy to apply a potential to the wiring layer. To supply a potential, therefore, a special design such as formation of a terminal trench 1 as shown in FIGS. 1 and 2 is used. This requires an additional photolithography step or the like, and the result is complexity in the whole fabrication process. Especially in formation of the terminal trench 1, a resist 5 must be removed from the terminal trench 1 in order to selectively remove an oxide film 6 on the side surfaces of the trench 1. In this case, if misalignment of patterns occurs as indicated by a resist 5' in FIG. 1, a disconnected portion 8a is formed between an N-type diffusion layer 8 around the terminal trench 1 and an N-type diffusion layer 7 at the bottom of a trench 2, preventing these diffusion layers from making contact with each other. In addition, it is highly probable that the resist 5 is not completely removed but left behind in the terminal trench 1. If the resist 5 remains in the terminal trench 1, the oxide film 6 is not completely removed, and an unremoved portion 6a remains on the wall surface of the terminal trench 1, as shown in FIG. 2. This residual oxide film 6a acts as a diffusion mask to cause, e.g., a diffusion error 8b. The diffusion error 8b introduces problems such as a disconnection in the N-type diffusion layer 8 or an increase in contact resistance between the wiring layer and the terminal. In addition, if the resist remains in the terminal trench, harmful impurities (such as heavy metals) contained in the resist may diffuse into the device to contaminate it. Note that reference numeral 3 denotes an element isolating $SiO_2$ film; 4, an $Si_3N_4$ film; and 10, a P-type semiconductor substrate.

SUMMARY OF THE INVENTION

The present invention has been made in consideration of the above situation and has its object to provide a semiconductor device with a structure, in which a potential can be easily supplied to a wiring layer formed in a semiconductor substrate, and which can be easily fabricated, and a method of fabricating the same.

According to an aspect of the present invention, there is provided a semiconductor device comprising: a semiconductor substrate of a first conductivity type; a first semiconductor region of a second conductivity type formed in the semiconductor substrate; a plurality of trenches formed adjacent to each other in the semiconductor substrate, an end of the plurality of trenches being formed at a predetermined position with respect to the first semiconductor region; and a plurality of second semiconductor regions of the second conductivity type each formed from at least the bottom of a corresponding one of the plurality of trenches into the semiconductor substrate, the second semiconductor regions contacting each other to constitute a wiring layer and being also in contact with the first semiconductor region.

According to another aspect of the present invention, there is provided a dynamic RAM comprising: a semiconductor substrate of a first conductivity type; a deep well-like first semiconductor region of a second conductivity type formed in the semiconductor substrate; a plurality of trenches of a predetermined depth formed adjacent to each other with predetermined intervals therebetween, one end of the plurality of trenches being formed at a predetermined position with respect to the first semiconductor region; a plurality of second semiconductor regions of the second conductivity type each formed from at least the bottom of a corresponding one of the plurality of trenches into the semiconductor substrate, the plurality of second semiconductor regions contacting each other and being also in contact with the first semiconductor region; a plurality of capacitors formed inside the plurality of trenches, one end of one electrode of the capacitors being connected to the second semiconductor regions; cell transistors each having source/drain regions of the second conductivity type and a gate electrode connected to a word line, one of the source/drain regions being connected to the other electrode of the capacitors; and a bit line electrically connected to the other region of the source/drain regions of the cell transistor.

According to still another aspect of the present invention, there is provided a method of fabricating a semiconductor device, comprising the steps of: forming a well-like first semiconductor region of a second conductivity type in a semiconductor substrate of a first conductivity type; forming a plurality of trenches adjacent to each other in the semiconductor substrate such that an end portion of the plurality of trenches is formed at a predetermined position with respect to the first semiconductor region; doping an impurity of the second conductivity type from bottom portions of the plurality of trenches into the semiconductor substrate; and diffusing the impurity to form a plurality of second semiconductor regions of the second conductivity type in the semiconductor substrate such that the plurality of second semiconductor regions are electrically connected to each other and also connected to the first semiconductor region.

According to still another aspect of the present invention, there is provided a method of fabricating a dynamic RAM, comprising the steps of: forming a deep well-like first semiconductor region of a second conductivity type in a semiconductor substrate of a first conductivity type; forming a shallow well-like second semiconductor region of the first conductivity type in the semiconductor substrate; forming a plurality of trenches adjacent to each other with predetermined intervals therebetween such that one end portion of the plurality of trenches is formed at a predetermined position with respect to the first semiconductor region; doping an impurity of the second conductivity type from bottom portions of the plurality of trenches into the semiconductor substrate to form a plurality of regions doped with the impurity of the second conductivity; diffusing the impurity of the impurity-doped regions by annealing to form a plurality of impurity-diffused layers such that the plurality of impurity-diffused layers contact each other and are also in contact with the first semiconductor region; forming capacitors in the trenches; forming a cell transistor a gate electrode of which is connected to the second semiconductor region; forming bit lines connected to one of source/drain regions of the cell transistor; and forming insulating interlayers on the entire surface and forming an electrode layer for supplying a potential to the plurality of impurity-diffused layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A-I to 6G-III are sectional views for explaining a method of fabricating the semiconductor device according to the third embodiment of the present invention.

DETAILED DESCRIPTION OF THE PREFERRED EMBODIMENTS

Embodiments of a semiconductor device and a method of fabricating the same according to the present invention will be described below with reference to the accompanying drawings.

Figure 3:
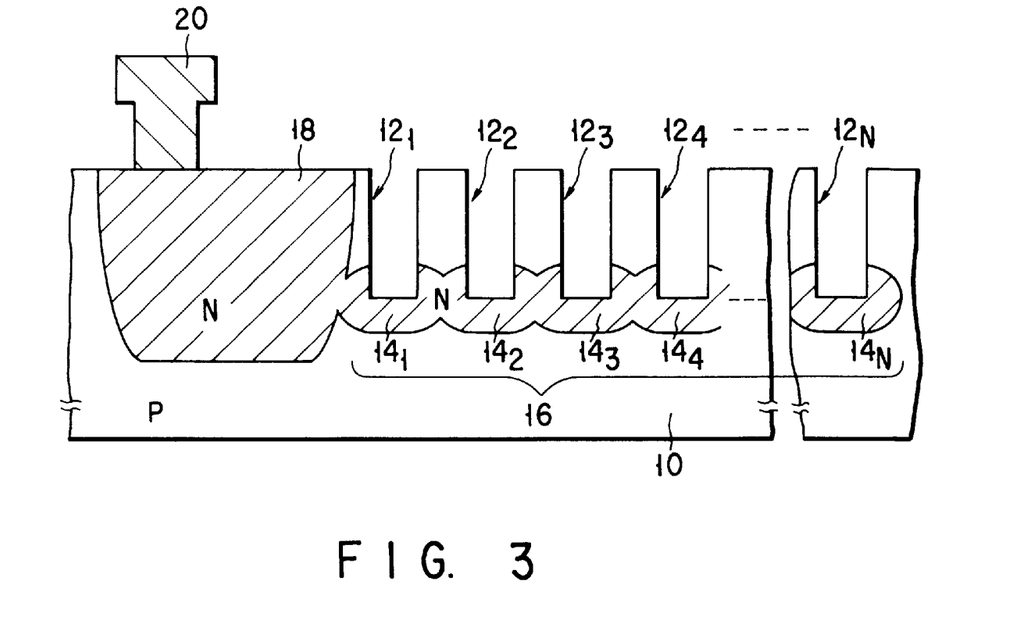
FIG. 3 is a sectional view showing the arrangement of a semiconductor device according to the first embodiment of the present invention.

FIG. 3 is a sectional view showing the arrangement of a semiconductor device according to the first embodiment of the present invention. As shown in FIG. 3, trenches $12_1$ to $12_N$ are formed in, e.g., a P-type silicon substrate 10. In the substrate 10, N-type diffusion layers $14_1$ to $14_N$ are formed from the bottoms of the trenches $12_1$ to $12_N$, respectively, by ion implantation or diffusion of an impurity. The N-type diffusion layers $14_1$ to $14_N$ are electrically connected to each other by contacting each other, thereby constituting a buried wiring layer 16 formed inside the substrate 10. In addition, a well-like N-type region 18 is formed in the substrate 10 by ion implantation or by diffusing an impurity from the surface of the substrate 10. This N-type region 18 serves as a potential extracting electrode. This N-type region 18 is electrically connected to the wiring layer 16 and is also electrically connected to an electrode layer 20. Although not shown, an element such as a capacitor having an electrode electrically connected to the wiring layer 16 is formed in each of the trenches $12_1$ to $12_N$. According to the semiconductor device with the above arrangement, a potential is supplied from a power supply to the wiring layer 16 via the electrode layer 20 and the N-type region 18. This makes potential supply to the wiring layer 16 feasible without forming any special structure, such as a terminal trench, unlike in conventional structures. In addition, the N-type region 18 can be formed not through a complicated step, such as removal of a resist from a trench, but by ion implantation or diffusion of an impurity from the surface of the substrate 10, so the formation of this region is easy. This can reduce occurrence of errors in fabrication and consequently can prevent a reduction in yield of devices. Furthermore, the N-type region 18 can be formed simultaneously with formation of an N-type well region (not shown) or an N-type collector extracting region (not shown) used in a vertical bipolar transistor. This simultaneous formation of the N-type region 18 and the N-type well region or the N-type collector extracting region can suppress an increase in the number of fabrication steps.

Figure 4:
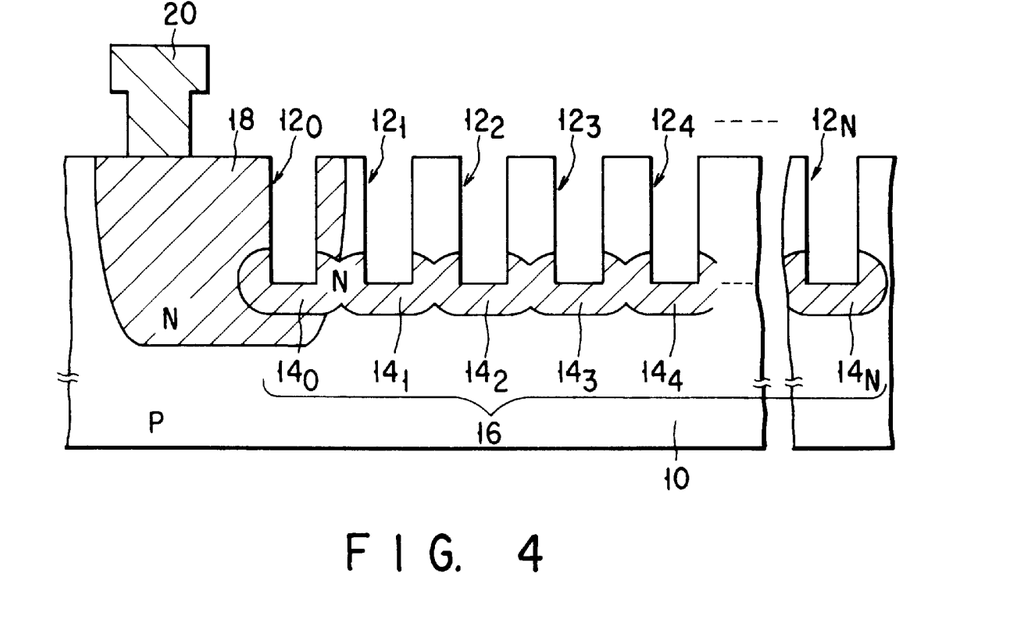
FIG. 4 is a sectional view showing the arrangement of a semiconductor device according to the second embodiment of the present invention.

FIG. 4 is a sectional view showing the arrangement of a semiconductor device according to the second embodiment of the present invention. As shown in FIG. 4, at least one trench $12_0$ is formed in a well-like N-type region 18 by the same fabrication steps as for other trenches $12_1$ to $12_N$. According to the semiconductor device with this arrangement, even if mask misalignment occurs in the formation of the trenches $12_0$ to $12_N$, contact between the N-type region 18 and a wiring layer 16 can be maintained because an N-type diffusion layer $14_0$ at the bottom of the trench $12_0$ exists in the N-type region 18. This ensures electrical connection between the N-type region 18 and the wiring layer 16 at any instant.

Figure 5A:
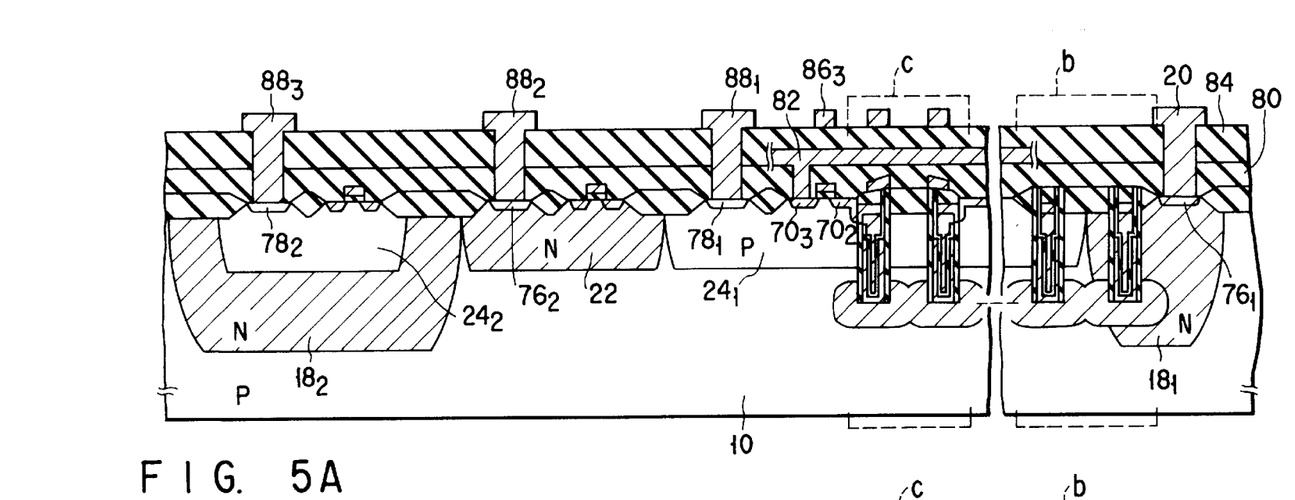
FIGS. 5A to 5C are sectional views for explaining the arrangement of a semiconductor device according to the third embodiment of the present invention.
Figure 5B:
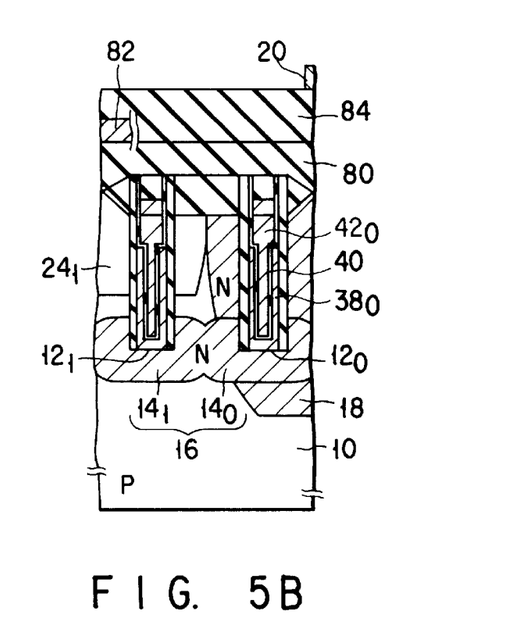
Figure 5C:
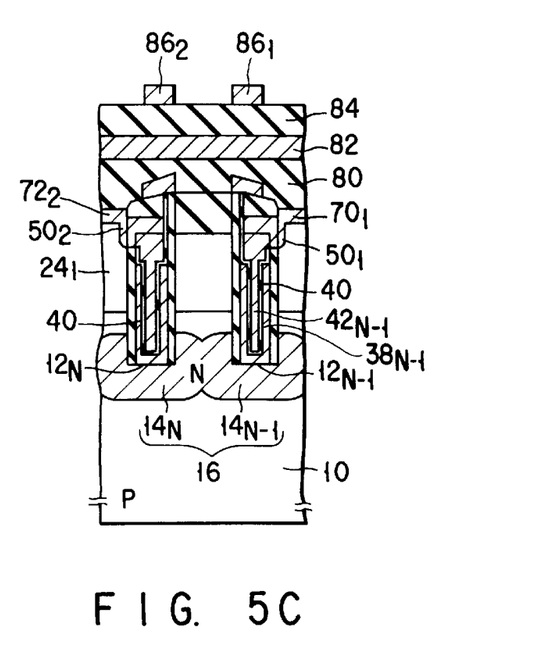

FIGS. 5A to 5C are sectional views for explaining the arrangement of a semiconductor device according to the third embodiment of the present invention. In the third embodiment, a semiconductor device according to the present invention is applied to a dynamic RAM with a sheath capacitor and a peripheral circuit constituted by a CMOS circuit. FIG. 5A is a sectional view showing the device according to the third embodiment, FIG. 5B is an enlarged view showing a portion near a buried wiring layer connecting portion b in FIG. 5A, and FIG. 5C is an enlarged view showing a portion near a sheath capacitor portion c in FIG. 5A. N-type wells $18_1$ and $18_2$, an N-type well 22, and a P-type well $24_1$ are formed in a P-type silicon substrate 10, and a P-type well $24_2$ is formed in this N-type well $18_2$. In a memory array formation portion of the N-type well $18_1$ and a P-type well $24_1$, a memory cell having a cell transistor, that includes an electrode layer $88_1$ for supplying a potential from a first potential source ($V_{bb}$), and sheath capacitors supplied with a potential from an electrode layer 20 via the extracting electrode layer $18_1$ and a buried wiring layer 16 are formed. A peripheral circuit PMOS having an electrode layer $88_2$ for supplying a potential from a second potential source ($V_{cc}$) is formed in the N-type well 22. A peripheral circuit NMOS having an electrode $88_3$ for supplying a potential from a third potential source ($V_{ss}$) is formed in the P-type well $24_2$. As shown in FIG. 5B, the buried wiring layer 16 is constituted by N-type impurity-diffused layers $14_0$ to $14_N$ formed in contact with each other at the bottoms of trenches $12_0$ to $12_N$, respectively. A portion each of the diffusion layers $14_0$ to $14_N$ is formed in the extracting electrode layer $18_1$. As shown in FIG. 5C, the sheath capacitors are constituted by a plate electrode 38, a storage node electrode 42, and a dielectric film 40 formed between them, all formed in the trenches $12_0$ to $12_N$.

Figures 1, 6A:
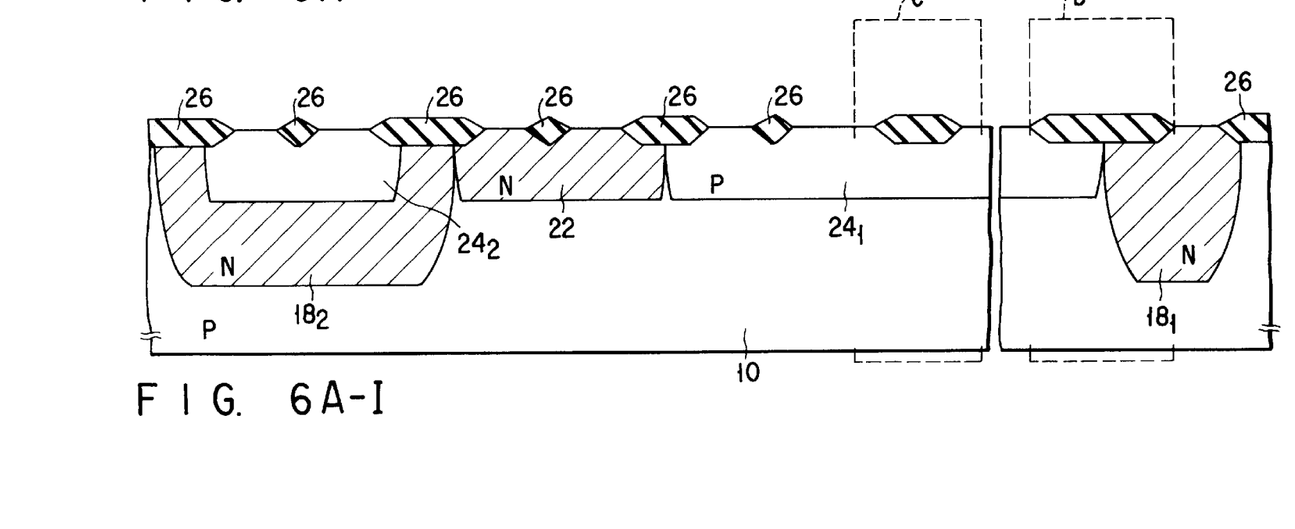
Figures 2, 6A:
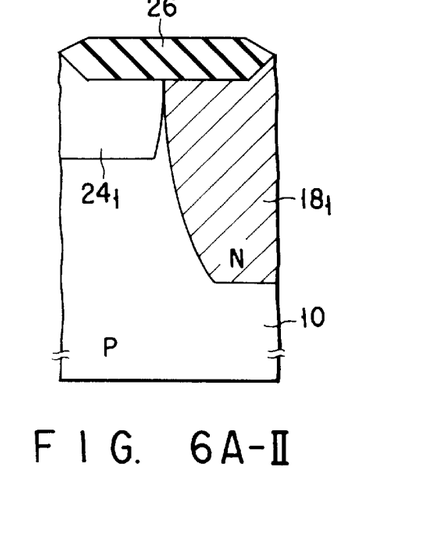
Figures 3, 6A:
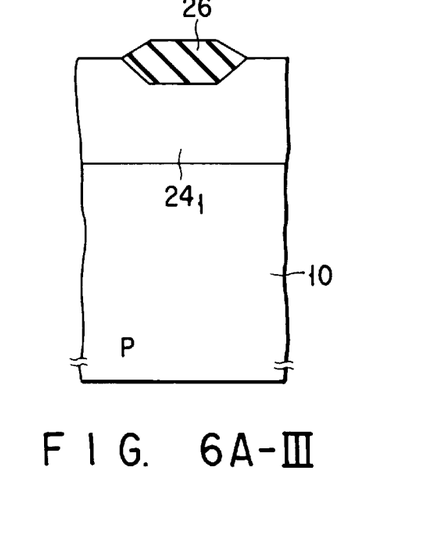
Figures 1, 6B:
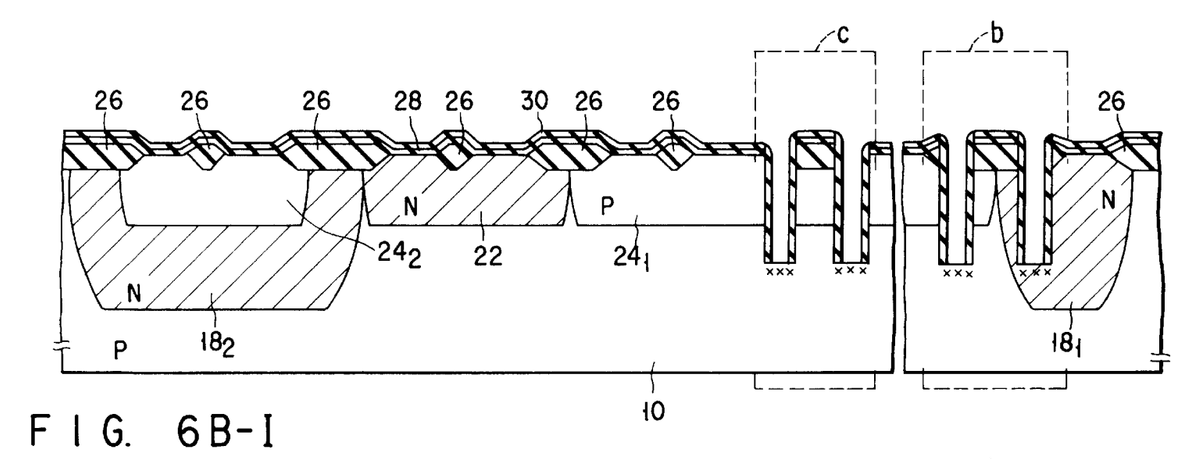
Figures 2, 6B:
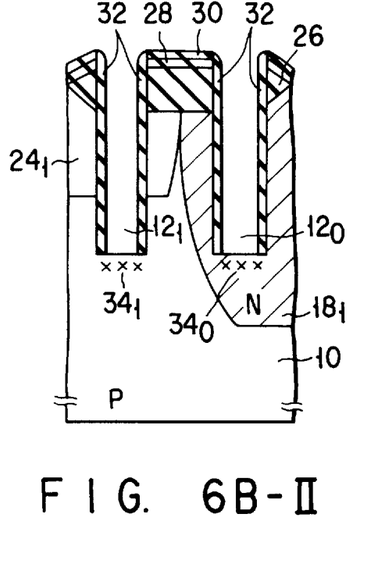
Figures 3, 6B:
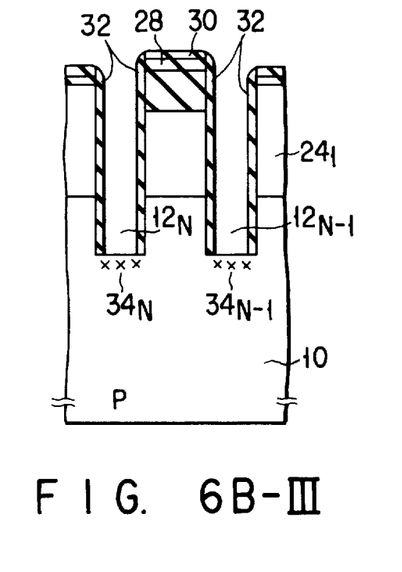
Figures 1, 6C:
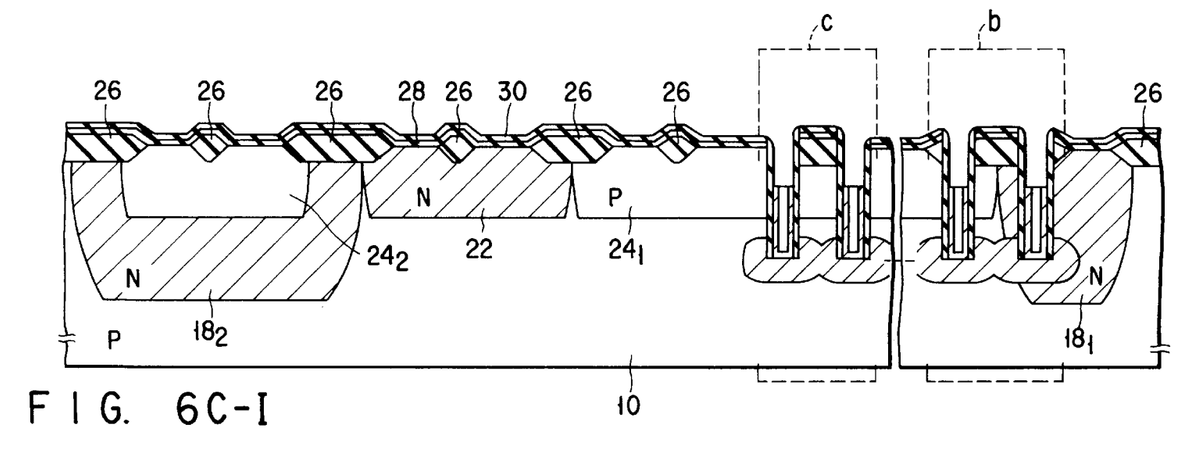
Figures 2, 6C:
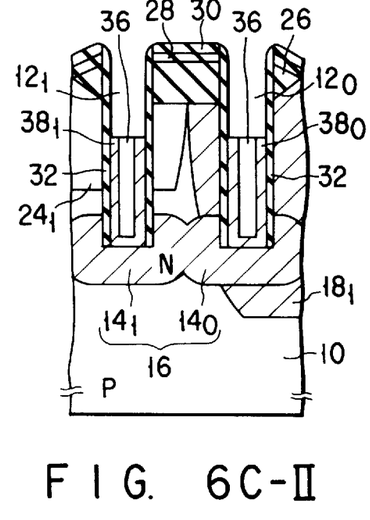
Figures 3, 6C:
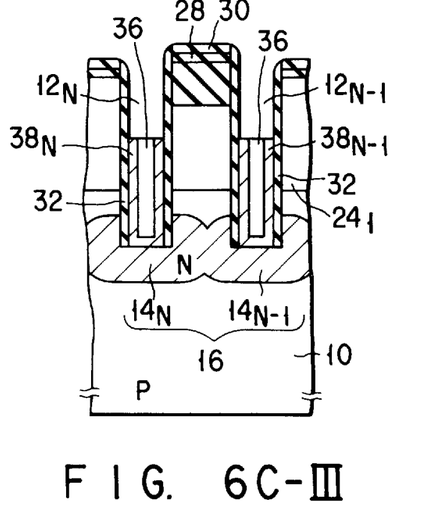
Figures 1, 6D:
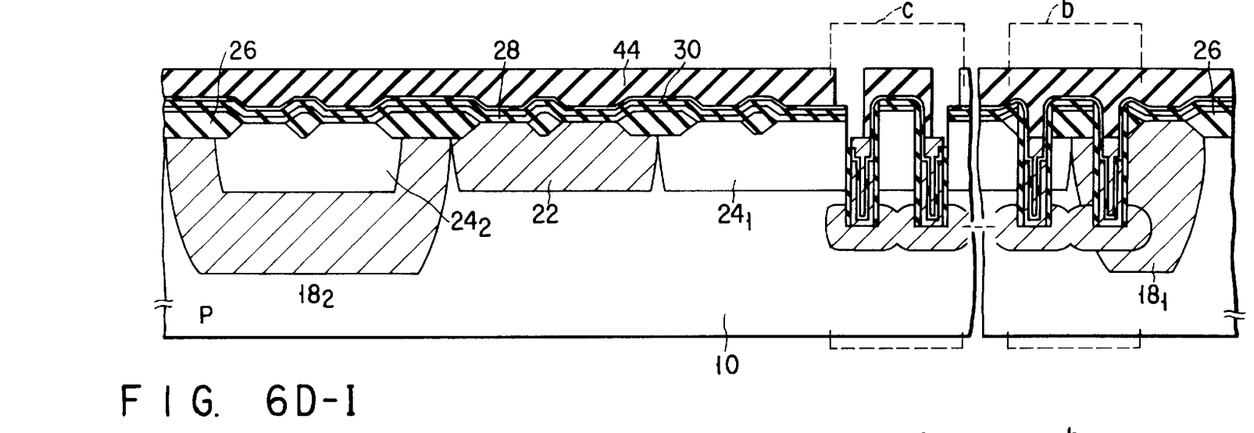
Figures 2, 6D:
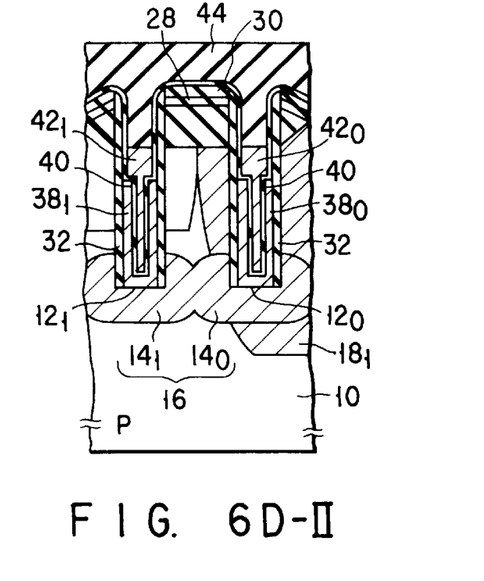
Figures 3, 6D:
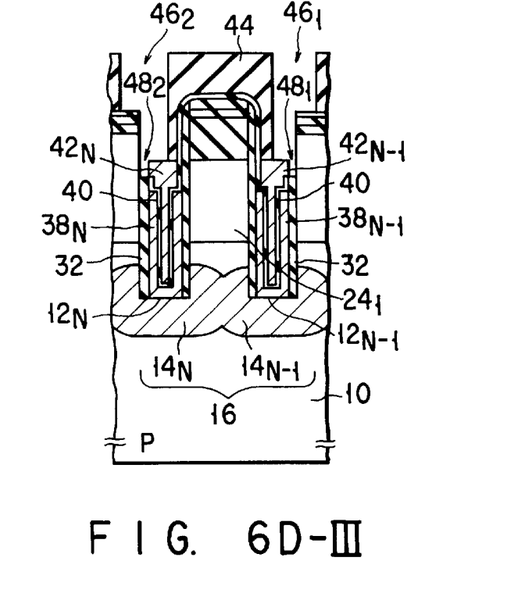
Figures 1, 6E:
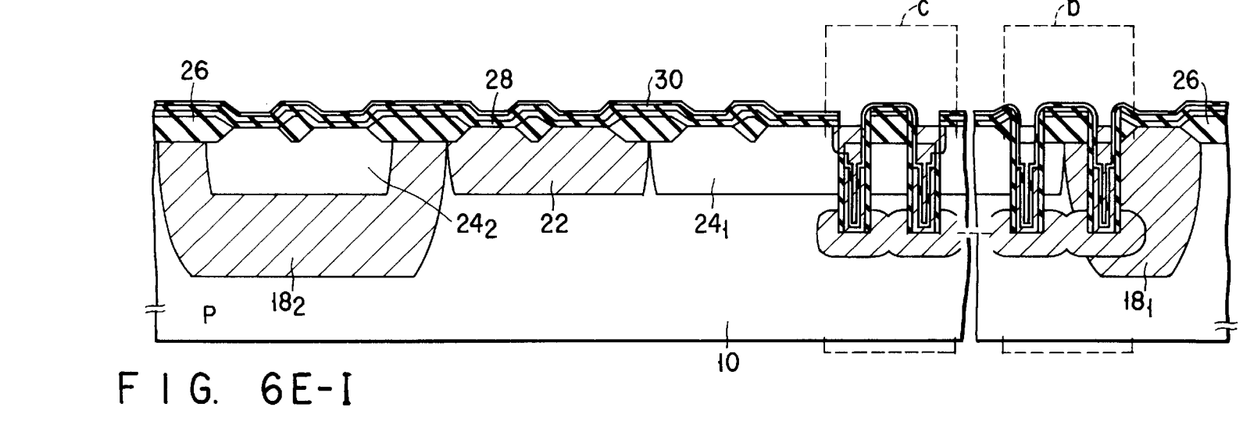
Figures 2, 6E:
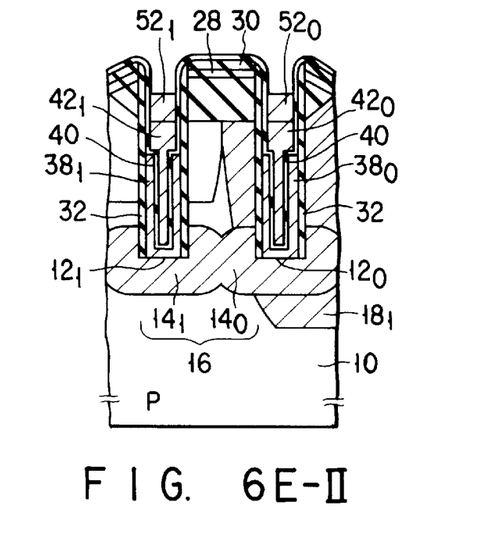
Figures 3, 6E:
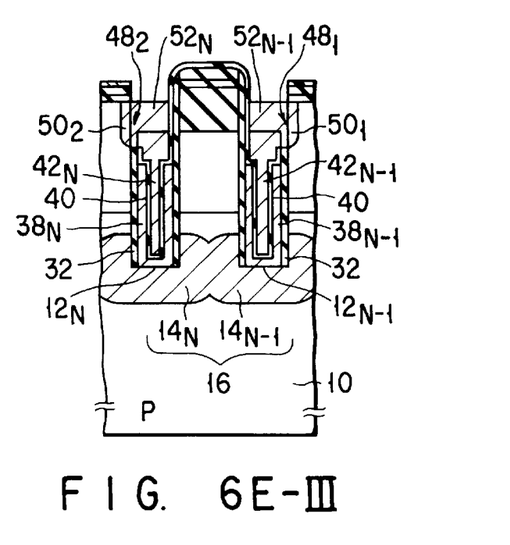
Figures 1, 6F:
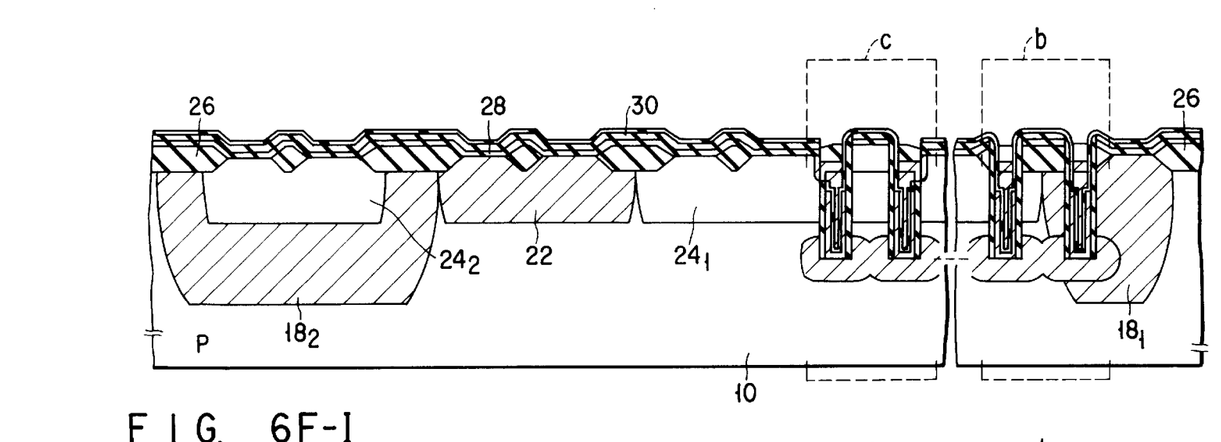
Figures 2, 6F:
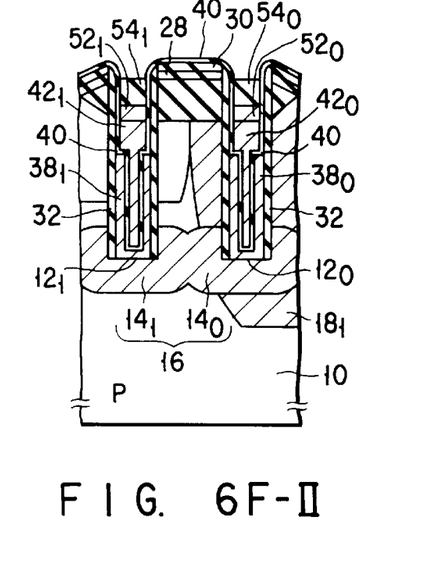
Figures 3, 6F:
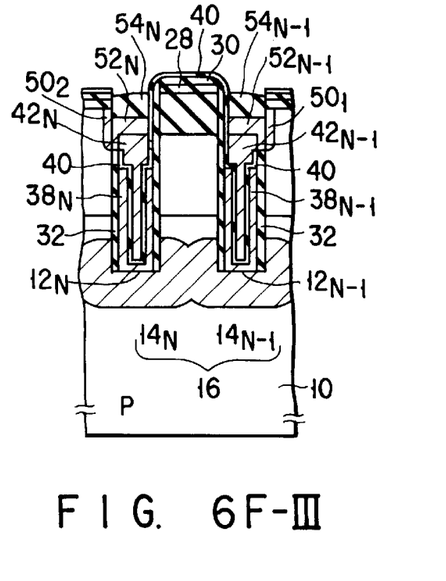
Figures 1, 6G:
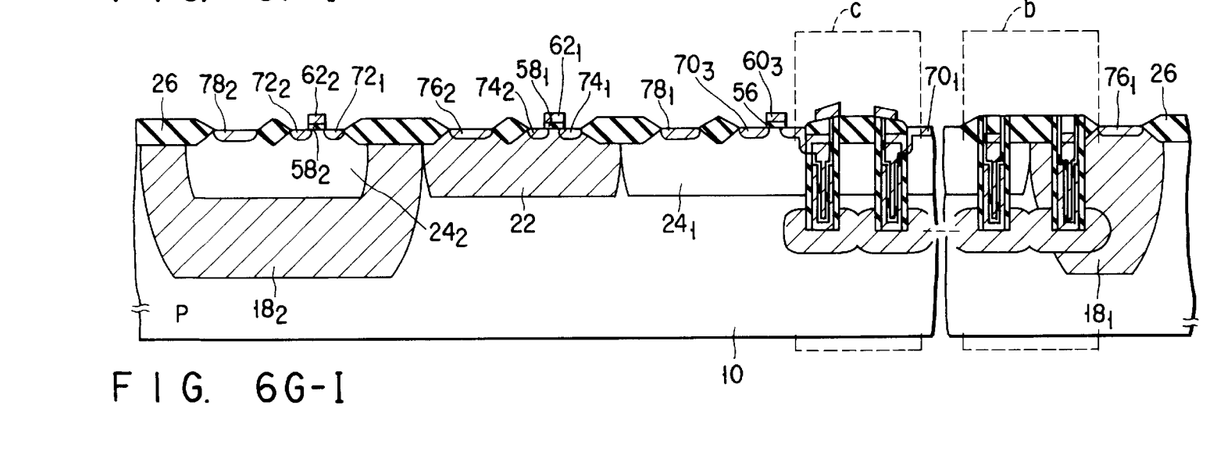
Figures 2, 6G:
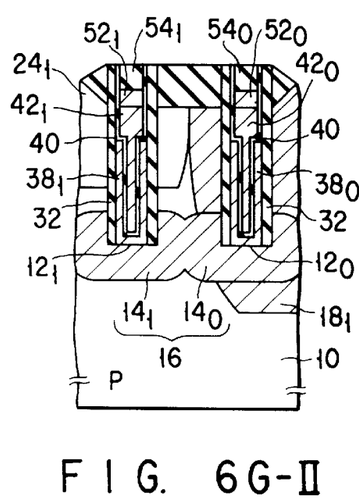
Figures 3, 6G:
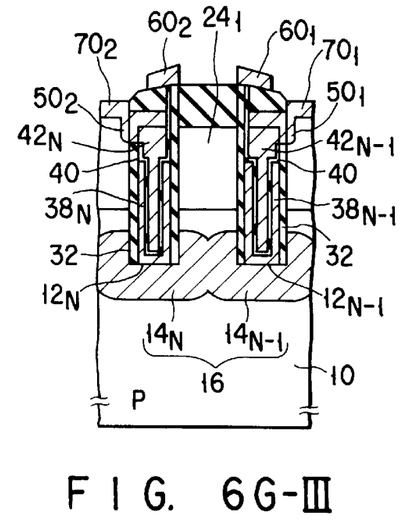

FIGS. 6A-I to 6G-III are sectional views for explaining a method of fabricating the semiconductor device according to the third embodiment of the present invention FIGS. 6A-II and 6A-III respectively illustrate an enlarged view of a portion near a buried wiring layer connecting portion b in FIG. 6A-I, and an enlarged view of a portion near a sheath capacitor portion c in FIG. 6A-I. Similarly, FIGS. 6B-II through 6G-II and 6B-III through 6G-III illustrate similar portions b and c of the structure shown in FIGS. 6B-I through 6G-I respectively. First, as shown in FIG. 6A-I, deep N-type well regions $18_1$ and $18_2$ are formed in a P-type silicon substrate 10 by, e.g., ion implantation and diffusion. Subsequently, an N-type well 22 and P-type wells $24_1$ and $24_2$ are formed in the substrate 10 by, e.g., ion implantation and diffusion. A field oxide film 26 is formed on the substrate 10 by, e.g., a LOCOS process. FIG. 6A-II is an enlarged view showing a portion near a buried wiring layer connecting portion b, and FIG. 6A-III is an enlarged view showing a portion near a sheath capacitor portion c. This will be the same in the following description.

As shown in FIGS. 6B-I to 6B-III, a thin silicon oxide ($SiO_2$) film 28 is formed on the substrate 10 by using, e.g., a thermal oxidation process or a CVD process. Subsequently, a silicon nitride ($SiN_x$) film 30 is formed on the oxide film 28 by, e.g., the CVD process. A plurality of trenches $12_0$ to $12_N$ about 3 µm in depth are formed adjacent to each other with predetermined intervals between them in the substrate 10 by, e.g., photolithography and RIE. The trenches $12_0$ to $12_N$ are formed particularly in a memory cell array formation portion of the substrate 10, i.e., a region where the P-type well $24_1$ is formed. The trenches $12_0$ to $12_N$ are so formed as to reach the substrate 10 through the edge of the field oxide film 26 and the P-type well $24_1$, and at least one trench $12_0$ is formed in the deep N-type well $18_1$. Subsequently, a silicon oxide ($SiO_2$) film 32 with a thickness of about 50 nm is formed on the entire upper surface of the substrate 10 by using, e.g., the CVD process. The silicon oxide film 32 is then etched back by RIE to remain on only the side walls of the trenches $12_0$ to $12_N$. The results are cylindrical portions consisting of the silicon oxide film 32 about 50 nm thick. Subsequently, an N-type impurity, such as phosphorus (P), is doped at a dose of about $1 \times 10^{16}$ cm$^{-2}$ by, e.g., ion implantation. Consequently, N-type impurity-implanted regions $34_0$ to $34_N$ are formed in portions of the substrate 10 exposed to the bottoms of the trenches $12_0$ to $12_N$, respectively. This ion implantation step is performed by using the nitride film 30 and the side-wall insulating film 32 as masks.

As shown in FIGS. 6C-I to 6C-III, a phosphorus-doped N-type polysilicon film is formed on the entire upper surface of the substrate 10 including the side and bottom surfaces of the trenches $12_0$ to $12_N$ by using, e.g., the CVD process. Subsequently, annealing is performed to activate the phosphorus present in the impurity-implanted regions $34_0$ to $34_N$, forming N-type diffusion layers $14_0$ to $14_N$. These diffusion layers $14_0$ to $14_N$ are so diffused into the substrate 10 as to contact each other, thereby constituting a buried wiring layer 16. The wiring layer 16 is also formed in contact with the deep N-type well $18_1$ and is consequently electrically connected with the N-type well $18_1$. Subsequently, a photoresist is coated on the entire upper surface of the substrate 10. The photoresist is then exposed to the middle levels of the trenches $12_0$ to $12_N$ by full-surface exposure, and the exposed portion of the photoresist is removed. The result is a photoresist layer 36 buried to the middle levels of the trenches $12_0$ to $12_N$. Subsequently, the polysilicon film is removed by using the photoresist layer 36 as a mask. As a result, as shown in FIGS. 6C-II and 6C-III in an enlarged scale, polysilicon films $38_0$ to $38_N$ formed to the middle levels of the trenches $12_0$ to $12_N$ are obtained. The polysilicon films $38_0$ to $38_N$ are electrically connected to the wiring layer 16 to serve as the plate electrodes of sheath capacitors.

As shown in FIGS. 6D-I to 6D-III, the photoresist layer 36 formed on the bottoms of the trenches $12_0$ to $12_N$ is removed. Thereafter, a stacked insulating film 40 consisting of an oxide film ($SiO_2$) and a nitride film ($SiN_x$) and having a thickness of about 5 nm, as a thickness of an oxide film, is formed on the polysilicon films $38_0$ to $38_N$ by using, e.g., the CVD process or a thermal oxidation/thermal nitriding process. This stacked insulating film 40 serves as the dielectric film of a sheath capacitor. Subsequently, a phosphorus-doped N-type polysilicon film 42 is formed on the entire upper surface of the substrate 10 by, e.g., the CVD process. This polysilicon film is then etched back to remain to the middle levels of the trenches $12_0$ to $12_N$. Consequently, polysilicon films $42_0$ to $42_N$ are formed. These polysilicon films $42_0$ to $42_N$ serve as the storage-node electrodes of sheath capacitors. Subsequently, a photoresist 44 is coated on the entire upper surface of the substrate 10. Windows $46_1$ and $46_2$ are formed in portions of the photoresist 44, which serve as storage-node connecting portions. As shown in FIG. 6D-III, the sheath (silicon dioxide ($SiO_2$) film) 32 and the stacked insulating film 40 are partially removed by RIE by using the photoresist 44 and the polysilicon films $42_{N-1}$ and $42_N$ as masks. The results are storage-node connecting portions $48_1$ and $48_2$ in which the P-type well $24_1$ is exposed to the side surfaces of the trenches $12_{N-1}$ and $12_N$.

As shown in FIGS. 6E-I to 6E-III, after the photoresist 44 is removed, an N-type impurity, such as phosphorus (P) or arsenic (As), is doped from the connecting portions $48_1$ and $48_2$ into the well $24_1$ by the use of, e.g., ion implantation. As a result, N-type regions $50_1$ and $50_2$ are formed in the P-type well $24_1$. Subsequently, a phosphorus-doped N-type polysilicon film 52 is formed on the entire upper surface of the substrate 10 by using, e.g., the CVD process. This polysilicon film is then etched back to remain to the middle levels of the trenches $12_0$ to $12_N$, thereby forming polysilicon films $52_0$ to $52_N$. The N-type regions $50_1$ and $50_2$ and the polysilicon films $42_{N-1}$ and $42_N$ are electrically connected with each other via the polysilicon films $52_{N-1}$ and $52_N$, respectively. Note that the N-type regions $50_1$ and $50_2$ may also be formed by diffusion of an impurity from the polysilicon films $52_{N-1}$ and $52_N$, respectively.

As shown in FIGS. 6F-I to 6F-III, the surface regions of the polysilicon films $52_0$ to $52_N$ are oxidized by, e.g., thermal oxidation by using the nitride film 30 as a mask, thereby forming silicon oxide (SiO$_2$) films $54_0$ to $54_N$. Consequently, the sheath-like oxide films 32 and $54_0$ to $54_N$ are formed on the inner side walls and top of the trenches $12_0$ to $12_N$. The obtained capacitors are sheath capacitors formed inside the trenches $12_0$ to $12_N$ covered with the sheath-like oxide films 32 and $54_0$ to $54_N$. In the third embodiment of the present invention, therefore, the capacitors of the same arrangement are formed inside the individual trenches, and no terminal trench with a specific internal arrangement exists.

As shown in FIGS. 6G-I to 6G-III, the oxide film 28, the nitride film 30, and exposed portions of the stacked insulating film 40 are removed. Subsequently, the surfaces of element formation regions of, e.g., the N-type well 22 and the P-type wells $24_1$ and $24_2$ are subjected to, e.g., thermal oxidation to form gate oxide (SiO$_2$) films $58_1$, 56, and $58_2$. A conductive layer consisting of, e.g., N-type polysilicon or a silicide is formed on the entire upper surface of the substrate 10 by using, e.g., the CVD process and patterned to form word lines $60_1$ to $60_3$ on the memory cell array region and gates $62_1$ and $62_2$ on the peripheral circuit region. Subsequently, an N-type impurity, such as phosphorus or arsenic, is ion-implanted into the P-type wells $24_1$ and $24_2$ by using a resist (not shown) or the like as a mask, thereby forming N-type source/drain regions $70_1$, $70_2$ and $70_3$ of a cell transistor, and N-type source and drain regions $72_1$ and $72_2$ of an N-channel MOSFET as a peripheral circuit and N-type contact regions $76_1$ and $76_2$. The N-type source/drain regions $70_1$ and $70_2$ are formed in contact with the N-type regions $50_1$ and $50_2$, respectively, and are thereby electrically connected with each other. After the resist is removed, a new resist (not shown) or the like is formed, and a P-type impurity, such as boron, is ion-implanted into the N-type well 22 by using this new resist as a mask. The results are P-type source and drain regions $74_1$ and $74_2$ of a P-channel MOSFET as a peripheral circuit and P-type contact regions $78_1$ and $78_2$.

Subsequently, as shown in FIGS. 5A to 5C, an insulating interlayer 80 consisting of, e.g., a silicon oxide (SiO$_2$) film is formed on the substrate 10 by using the CVD process or the like. Contact holes reaching the N-type source/drain region $70_3$ and the like are then formed in the insulating interlayer 80. A conductive layer consisting of, e.g., a silicide or an aluminum alloy is formed on the insulating interlayer 80 by, e.g., the CVD process or sputtering and patterned to form a wiring layer 82 such as bit lines. Subsequently, an insulating interlayer 84 consisting of, e.g., a silicon oxide (SiO$_2$) film is formed on the insulating interlayer 80 so as to cover the wiring layer 82 by using, e.g., the CVD process. Contact holes reaching the N-type contact regions $76_1$ and $76_2$, the P-type contact regions $78_1$ and $78_2$, and the like are formed in the insulating interlayers 80 and 84. A conductive layer consisting of, e.g., an aluminum alloy is formed on the insulating interlayer 84 by sputtering or the like and patterned to form an electrode layer 20 for supplying a potential to the wiring layer 16, several different wiring layers $86_1$ to $86_3$, and electrode layers $88_1$ to $88_3$ for supplying a potential to the individual wells. The device according to the third embodiment of the present invention is fabricated through the above steps.

According to the dynamic RAM having the sheath capacitors with the above arrangement, a predetermined potential, such as a half-VCC-level potential, can be supplied to the wiring layer 16 via the N-type well $18_1$. In addition, it is possible to omit the step of forming a terminal trench, which is a problem in formation of conventional devices of this type, from the fabrication steps of the present invention. This makes unnecessary the photolithography step of removing an oxide film from the side surfaces of a terminal trench, eliminating the problem of a residual oxide film. This can solve problems, such as an increase in contact resistance between a wiring layer and a terminal. Furthermore, the above fabrication steps can reduce the probability of a resist remaining in a trench compared to the fabrication steps for conventional devices and can also minimize a problem of contamination due to impurities.

The dynamic DRAM described in the above third embodiment can also be operated to achieve the effects equivalent to those of the dynamic DRAM introduced in, e.g., "Process Technologies for A High Speed 16M DRAM with Trench Type Cell" S. Yoshikawa et al., Symposium on VLSI Technology Digest of Technical Papers, 1989, pp. 67 and 68. That is, in the dynamic RAM described in the third embodiment, the deep N-type well $18_2$ is formed in the P-type silicon substrate 10. Therefore, this dynamic DRAM can also be operated in the same fashion as a dynamic RAM with a triple-well structure by supplying a potential Vbb to the electrode layer $88_1$, a potential Vcc (power supply voltage) to the electrode layer $88_2$, a potential Vss to the electrode layer $88_3$, and a potential Vcc/2 (plate potential) to the electrode layer 20. This consequently improves the circuit performance.

According to the present invention as has been described above, there are provided a semiconductor device with a structure, in which a potential can be easily supplied to a wiring layer formed in a semiconductor substrate, and which can be easily formed, and a method of fabricating the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic random access memory device comprising:
   a semiconductor substrate of a first conductivity type;
   a well region of a second conductivity type formed in said semiconductor substrate, said well region having a first width at a level which is located between a top and bottom thereof;
   a plurality of trenches formed in said semiconductor substrate, said trenches being spaced apart from each other and a first trench of said trenches having an upper portion formed within a top surface of said well region;
   semiconductor regions formed in said semiconductor substrate at bottom portions of said trenches, each semiconductor region having a second width less than the first width at a level which is located between a top and a bottom thereof and said semiconductor regions contacting each other to form a wiring layer;
   capacitors formed in each of said plurality of trenches, each capacitor having a storage node insulated from said wiring layer;
   switching transistors coupled to said capacitors formed in said trenches other than said first trench and at least a second trench adjacent to said first trench, each switching transistor comprising a gate electrode and a source/ drain electrode coupled to the storage node of a respective corresponding one of said capacitors; and a bit line coupled to a drain/source eletrode of each of said switching transistors.

2. The dynamic random access memory device according to claim 1, further comprising an electrode, electrically connected to said well region, for applying a potential to said wiring layer via said well region.

3. A dynamic random access memory device comprising:

a semiconductor substrate of a first conductivity type;

a well region of a second conductivity type formed in said semiconductor substrate, said well region having a first width at a level which is located between a top and bottom thereof;

a plurality of trenches formed in said semiconductor substrate, said trenches being spaced apart from each other and a first trench of said trenches having an upper portion formed within a top surface of said well region;

semiconductor regions formed in said semiconductor substrate at bottom portions of said trenches, each semiconductor region having a second width less than the first width at a level which is located between a top and a bottom thereof and said semiconductor regions contacting each other to form a wiring layer;

capacitors formed in each of said plurality of trenches, each capacitor having a storage node and an insulating film, said storage node being insulated from said wiring layer by the insulating film;

switching transistors coupled to said capacitors formed in said trenches other than said first trench and at least a second trench adjacent to said first trench, each switching transistor comprising a gate electrode and a source/ drain electrode coupled to the storage node of a respective corresponding one of said capacitors; and a bit line coupled to a drain/source electrode of each of said switching transistors.

4. A dynamic random access memory device comprising:

a semiconductor substrate of a first conductivity type;

a first well region of a second conductivity type formed in a major surface of said semiconductor substrate, said first well region having a first width between the two edges of said first well region and halfway between the top and bottom surfaces of said first well region;

a first trench having an upper portion located within the top surface of said first well region;

a plurality of second trenches formed in said major surface of said semiconductor substrate;

at least one third trench formed in said major surface of said semiconductor substrate, said third trench located between said first trench and said second trenches;

semiconductor regions formed at bottom portions of said first trench, said second trenches and said third trench respectively, and within said first well region and said semiconductor substrate, said semiconductor regions each having a second width between the two edges of one of said semiconductor regions and halfway between the top and bottom surfaces of said one of said semiconductor regions less than said first width, and said semiconductor regions contacting each other to form a wiring layer;

capacitors respectively formed in said first trench, said second trenches and said third trench, wherein each of said capacitors has a storage node insulated from said wiring layer;

cell transistors formed in said major surface of said semiconductor substrate, each cell transistor having a gate electrode and source/drain regions of the second conductivity type, wherein a first source/drain region of each of said cell transistors is respectively connected to the storage node of only those of said capacitors formed in said second trenches; and a bit line electrically connected to a second source/drain region of each of said cell transistors.

5. The device according to claim 4, further comprising an electrode, electrically connected to said first well region, for applying a predetermined potential to said wiring layer via said first well region.

6. A dynamic random access memory device comprising:

a semiconductor substrate of a first conductivity type;

a well region of a second conductivity type formed in said semiconductor substrate, said well region having a first width at a level which is halfway between the top and bottom thereof;

a plurality of trenches formed in said semiconductor substrate, said trenches being spaced apart from each other and a first trench of said trenches having an upper portion formed within the top surface of said well region;

semiconductor regions formed in said semiconductor substrate at bottom portions of said trenches, each semiconductor region having a second width less than the first width at a level which is halfway between a top and a bottom thereof and said semiconductor regions contacting each other to form a wiring layer;

capacitors formed in each of said plurality of trenches, each capacitor comprising a storage node insulated from said wiring layer;

switching transistors coupled to said capacitors formed in said trenches other than said first trench and at least a second trench adjacent to said first trench, each switching transistor comprising a gate electrode and a source/ drain electrode coupled to the storage node of a respective corresponding one of said capacitors; and a bit line coupled to a drain/source electrode of each of said switching transistors.

7. The dynamic random access memory device according to claim 6, further comprising:

an electrode, electrically connected to said well region, for applying a potential to said wiring layer via said well region.

8. The dynamic random access memory device according to claim 6, wherein said capacitors comprise sheath capacitors.

9. A dynamic random access memory device comprising:

a semiconductor substrate of a first conductivity type;

a first well region of a second conductivity type formed in said semiconductor substrate, said first well region having a first width at a level which is halfway between the top and bottom thereof;

a second well region of the first conductivity type formed in said semiconductor substrate;

a third well region of the second conductivity type formed in said semiconductor substrate;

a fourth well region of the second conductivity type formed in said semiconductor substrate;

a fifth well region of the first conductivity type formed in said fourth well region;

a plurality of spaced apart trenches, a first of said trenches having an upper portion within the top surface of said first well region, and the remainder of said trenches formed to extend through said second well region;

semiconductor regions formed in said semiconductor substrate at bottom portions of said trenches, each semiconductor region having a second width less than the first width at a level which is halfway between the top and bottom thereof and said semiconductor regions contacting each other to form a wiring layer disposed below said second well region;

capacitors formed in said trenches, each capacitor comprising a storage node insulated from said wiring layer;

switching transistors coupled to said capacitors formed in said trenches other than said first trench and at least a second trench adjacent to said first trench, each switching transistor comprising a gate electrode and a source/drain electrode coupled to the storage node of a respective corresponding one of said capacitors;

a bit line coupled to a drain/source electrode of each of said switching transistors;

a first electrode, electrically connected to said first well region, for applying a first potential to said wiring layer via said first well region;

a second electrode, electrically connected to said second well region, for applying a second potential to said second well region;

a third electrode, electrically connected to said third well region, for applying a third potential to said third well region; and a fourth electrode, electrically connected to said fifth well region, for applying a fourth potential to said fifth well region.

10. A dynamic random access memory device comprising:

a semiconductor substrate of a first conductivity type;

a first well region of a second conductivity type formed in a major surface of said semiconductor substrate, said first well region having a first width between two edges which are located between top and bottom surfaces of said first well region;

a first trench having an upper portion located within the top surface of said first well region;

a plurality of second trenches formed in said major surface of said semiconductor substrate;

at least one third trench formed in said major surface of said semiconductor substrate, said third trench located between said first trench and said second trenches;

semiconductor regions formed at bottom portions of said first trench, said second trenches and said third trench respectively, and within said first well region and said semiconductor substrate, said semiconductor regions each having a second width between two edges which are located between top and bottom surfaces of one of said semiconductor regions less than said first width, and said semiconductor regions contacting each other to form a wiring layer;

capacitors respectively formed in said first trench, said second trenches and said third trench, wherein each of said capacitors has a storage node insulated from said wiring layer;

cell transistors formed in said major surface of said semiconductor substrate, each cell transistor having a gate electrode and source/drain regions of the second conductivity type, wherein a first source/drain region of each of said cell transistors is respectively connected to the storage node of only those of said capacitors formed in said second trenches; and a bit line electrically connected to a second source/drain region of each of said cell transistors.

11. The dynamic random access memory device according to claim 10 further comprising an electrode electrically connected to said first well region for applying a predetermined potential to said wiring layer via said first well region.

12. A dynamic random access memory device comprising:

a semiconductor substrate of a first conductivity type;

a first well region of a second conductivity type formed in said semiconductor substrate, said first well region having a first width at a level which is located between a top and bottom thereof;

a second well region of the first conductivity type formed in said semiconductor substrate;

a third well region of the second conductivity type formed in said semiconductor substrate;

a fourth well region of the second conductivity type formed in said semiconductor substrate;

a fifth well region of the first conductivity type formed in said fourth well region;

a plurality of spaced apart trenches, a first trench of said trenches having an upper portion within a top surface of said first well region, and the remainder of said trenches formed to extend through said second well region;

semiconductor regions formed in said semiconductor substrate at bottom portions of said trenches, each semiconductor region having a second width less than the first width at a level which is located between a top and bottom thereof and said semiconductor regions contacting each other to form a wiring layer disposed below said second well region;

capacitors formed in said trenches, each capacitor having a storage node insulated from said wiring layer;

switching transistors coupled to said capacitors formed in said trenches other than said first trench and at least a second trench adjacent to said first trench, each switching transistor comprising a gate electrode and a source/drain electrode coupled to the storage node of a respective corresponding one of said capacitors;

a bit line coupled to a drain/source electrode of each of said switching transistors;

a first electrode, electrically connected to said first well region, for applying a first potential to said wiring layer via said first well region;

a second electrode, electrically connected to said second well region, for applying a second potential to said second well region;

a third electrode, electrically connected to said third well region, for applying a third potential to said third well region; and a fourth electrode, electrically connected to said fifth well region, for applying a fourth potential to said fifth well region.

13. A dynamic random access memory device comprising:

a semiconductor substrate of a first conductivity type;

a first well region of a second conductivity type formed in a major surface of said semiconductor substrate, said first well region having a first width between two edges which are located between top and bottom surfaces of said first well region;

a first trench having an upper portion located within the top surface of said first well region;

a plurality of second trenches formed in said major surface of said semiconductor substrate;

at least one third trench formed in said major surface of said semiconductor substrate, said third trench located between said first trench and said second trenches;

semiconductor regions formed at bottom portions of said first trench, said second trenches and said third trench respectively, and within said first well region and said semiconductor substrate, said semiconductor regions each having a second width between two edges which are located between top and bottom surfaces of one of said semiconductor regions less than said first width, and said semiconductor regions contacting each other to form a wiring layer;

capacitors respectively formed in said first trench, said second trenches and said third trench, wherein each of said capacitors has a storage node and an insulating film, said storage node being insulated from said wiring layer by the insulating film;

cell transistors formed in said major surface of said semiconductor substrate, each cell transistor having a gate electrode and source/drain regions of the second conductivity type, wherein a first source/drain region of each of said cell transistors is respectively connected to the storage node of only those of said capacitors formed in said second trenches; and a bit line electrically connected to a second source/drain region of each of said cell transistors.

14. A dynamic random access memory device comprising:

a semiconductor substrate of a first conductivity type;

a first well region of a second conductivity type formed in said semiconductor substrate, said first well region having a first width at a level which is located between a top and bottom thereof;

a second well region of the first conductivity type formed in said semiconductor substrate;

a third well region of the second conductivity type formed in said semiconductor substrate;

a fourth well region of the second conductivity type formed in said semiconductor substrate;

a fifth well region of the first conductivity type formed in said fourth well region;

a plurality of spaced apart trenches, a first trench of said trenches having an upper portion within a top surface of said first well region, and the remainder of said trenches formed to extend through said second well region;

semiconductor regions formed in said semiconductor substrate at bottom portions of said trenches, each semiconductor region having a second width less than the first width at a level which is located between a top and bottom thereof and said semiconductor regions contacting each other to form a wiring layer disposed below said second well region;

capacitors formed in said trenches, each capacitor having a storage node and an insulating film, said storage node being insulated from said wiring layer by the insulating film;

switching transistors coupled to said capacitors formed in said trenches other than said first trench and at least a second trench adjacent to said first trench, each switching transistor comprising a gate electrode and a source/drain electrode coupled to the storage node of a respective corresponding one of said capacitors;

a bit line coupled to a drain/source electrode of each of said switching transistors;

a first electrode, electrically connected to said first well region, for applying a first potential to said wiring layer via said first well region;

a second electrode, electrically connected to said second well region, for applying a second potential to said second well region;

a third electrode, electrically connected to said third well region, for applying a third potential to said third well region; and a fourth electrode, electrically connected to said fifth well region, for applying a fourth potential to said fifth well region.

* * * * *